(12) United States Patent
Maru

(10) Patent No.: US 6,337,890 B1
(45) Date of Patent: Jan. 8, 2002

(54) LOW-POWER-CONSUMPTION VITERBI DECODER

(75) Inventor: Tsuguo Maru, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/143,021

(22) Filed: Aug. 28, 1998

(30) Foreign Application Priority Data

Aug. 29, 1997 (JP) .............................................. 9-233655

(51) Int. Cl.$^7$ ............................. H03D 1/00; H04L 27/06
(52) U.S. Cl. ........................ 375/341; 375/262; 714/795
(58) Field of Search ................................ 375/341, 262, 375/265; 714/795, 794, 796, 792

(56) References Cited

U.S. PATENT DOCUMENTS

| | | | |
|---|---|---|---|
| 4,777,636 A | * 10/1988 | Yamashita et al. | 714/795 |
| 4,905,317 A | 2/1990 | Suzuki et al. | |
| 5,045,714 A | 9/1991 | Park et al. | |
| 5,220,570 A | 6/1993 | Lou et al. | |
| 5,533,065 A | * 7/1996 | Blaker et al. | 375/341 |
| 5,970,097 A | * 10/1999 | Ishikawa et al. | 375/262 |
| 5,987,490 A | * 11/1999 | Alidina et al. | 708/523 |

FOREIGN PATENT DOCUMENTS

| | | |
|---|---|---|
| JP | 63-121322 | 5/1988 |
| JP | 2-170725 | 7/1990 |
| JP | 2-170726 | 7/1990 |
| JP | 2-196524 | 8/1990 |
| JP | 2-196525 | 8/1990 |
| JP | 6-112848 | 4/1994 |
| JP | 6-204896 | 7/1994 |
| JP | 6-260944 | 9/1994 |
| JP | 7-22969 | 1/1995 |
| JP | 7-202725 | 8/1995 |
| JP | 7-336239 | 12/1995 |
| JP | 8-46524 | 2/1996 |

OTHER PUBLICATIONS

Biver M. et al.: "Architectural Design and Realization of a Single–chip viterbi Decoder" Integration, The VLSI Journal, NL, North–Holland Publishing Company. Amsterdam, vol. 8, No. 1, Oct. 1, 1989, pp. 3–16, XP000071846, ISSN: 0167–9260, *p. 12, paragraph 2 – p. 13, paragraph 4; figure 11 * and *p. 11, line 18 – p. 12, line 3; figure 10*.

(List continued on next page.)

Primary Examiner—Chi Pham
Assistant Examiner—Phuong Phu
(74) Attorney, Agent, or Firm—Ostrolenk, Faber, Gerb & Soffen, LLP

(57) ABSTRACT

A Viterbi decoder for Viterbi-decoding an input signal, includes a path memory, a shift register, and a traceback circuit. The shift register has at least (constraint length −1) bits as the number of stages. The traceback circuit inputs, to the shift register, the AND per bit between a signal generated by a decoder connected to the shift register and the content of the path memory designated by a traceback address counter.

10 Claims, 7 Drawing Sheets

OTHER PUBLICATIONS

Cypher R. et al.: "Generalized Trace–Back Techniques for Survivor Memory Management in the Viterbi Algorithm" Journal of VSLI Signal Processing Systems for Signal, Image, and Video Technology, Kluwer Academic Publishers, Dordrecht, NL, vol. 5, No. 1, 1993, pp. 85–94, XP000364288, ISSN: 0922–5773 * p. 91, right–hand column, line 36 – p. 92, left–hand column, line 45*.

Nikkei Electronics, No. 602, 1994, pp. 15–16.

Gennady Feygin et al: "Architectural Tradeoffs for Survivor Sequence Memory management in Viterbi Decoders" IEEE Transactions on Communications, US, IEEE Inc., New York, vol. 41, No. 3, Mar. 1, 1993, pp. 425–429 XP000372685 ISSN: 0090–6778, *p. 425, right–hand column, line 10–right–hand column, line 26*.

Feygin G. et al.: "A VLSI Implementation of A Cascade Viterbi Decoder With Traceback Proceedings of the International Symposium on Circuits and Systems (ISCS)", US, New York, IEEE, vol.—, May 3, 1993, pp. 1945–1948, XP000390073, ISBN: 0–7803–1281–3 *p. 1946, right–hand column, line 39–p. 1947, right–hand column, line 5*.

Fettweis G. et al: "High–Speed Parallel Viterbi Decoding: Algorithm and VLSI–Architecture" IEEE Communicaton Magazine Piscataway, NJ, US, vol. 29, No. 5, May 1 1991, pp. 46–55, XP000231084, ISSN: 0163–6804 *p. 53, left–hand column, line 12 –right–hand column line 10, figure 11*.

* cited by examiner

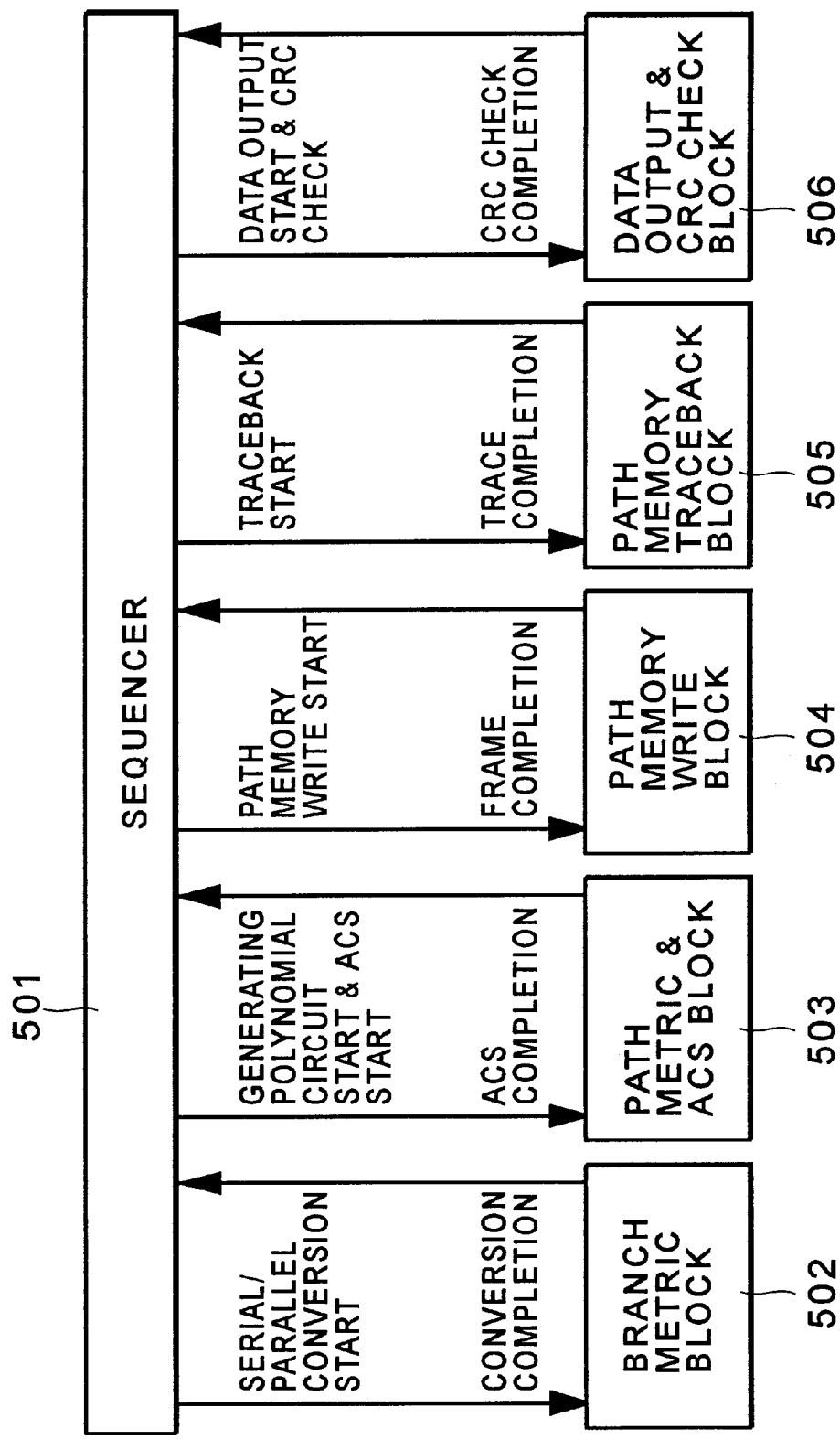

LOW-POWER-CONSUMPTION VITERBI DECODER

BACKGROUND OF THE INVENTION

1. Field of the Invention

The present invention relates to a Viterbi decoder having a very-low-power-consumption Viterbi decoding LSI and, more particularly, to a portable telephone Viterbi decoder using a CDMA system for performing Viterbi decoding even during a standly mode.

2. Description of the Prior Art

Viterbi decoders for convolution codes have conventionally been used for satellite communication and the like as an error correction system having a very high random error correction capability. This system requires a very high operation speed and a large frame length. A Viterbi decoding LSI must perform memory truncation of truncating path memories at an appropriate state. FIG. 1 shows an example of path memories and a maximum likelihood decision circuit in a Viterbi decoding LSI which satisfies the requirement. As shown in FIG. 1, after the switches are switched between the upper and lower contacts by a path select signal Ai+1( ), the contents of shift registers are shifted between rows and sequentially repeatedly updated at a time. The maximum likelihood decision circuit detects a path having maximum path metric at time i+1. The switch is changed over to a corresponding shift register to read its contents, which serve as a maximum likelihood decoded output. To implement this by one chip, however, many gates must be operated at a high speed, resulting in very high power consumption.

In recent years, Viterbi decoding is being used in a digital portable telephone system and a portable telephone system based on CDMA. These systems use a low operation speed and a relatively small frame length, unlike satellite communication.

In these systems, the power consumption must be low because their power supply is a battery for portability. As a current low-power-consumption Viterbi decoder, one having a dedicated Viterbi decision circuit incorporated in a digital portable telephone system DSP has been reported (see NIKKEI ELECTRONICS, No. 602, 1994, pp. 15–16).

To prolong the telephone conversation time and reduce the battery capacity for enhanced portability, the power consumption must be further reduced. Particularly n the CDMA system for performing Viterbi decoding even during a standly mode, reduction in power consumption is essential.

Of current low-power-consumption Viterbi decoders, one having a dedicated Viterbi decision circuit incorporated in a digital portable telephone system DSP can execute two add-compare-select (ACS) operations within six cycles. However, detection of path memories and maximum likelihood decision necessary for Viterbi decoding are performed by software. In addition, metric information required for ACS operation is frequently externally accessed. Particularly in soft decision, the number of metric information bits increases to increase the overhead. This makes it difficult to reduce the power consumption.

The CDMA system exploits a RAKE receiver. A signal decoded by phase estimation and amplitude estimation at each finger has a squared amplitude for both I and Q signals. In attaining Viterbi decoding robust against level variations such as Rayleigh fading, a metric serving as soft decision information is preferably squared. For this reason, soft decision information has a double bit width. This further increases the overhead in the conventional decoder.

SUMMARY OF THE INVENTION

The present invention has been made in consideration of the above situation, and has as its object to provide a small-size, light-weight Viterbi decoder capable of reducing the power consumption and improving the operability.

To achieve the above object, according to the first aspect of the present invention, there is provided a Viterbi decoder for Viterbi-decoding an input signal, comprising a path memory, a shift register having at least 9 constraint length −1) bits as the number of stages, and a traceback circuit for inputting, to the shift register, an AND per bit (i.e. bit-wise) between a signal generated by a decoder connected to the shift register and a content of the path memory designated by a traceback address counter.

According to the second aspect of the present invention, there is provided a Viterbi decoder comprising a traceback circuit including a path memory constituted by a first RAM, an ACS circuit including a path metric memory constituted by a second RAM, and a branch metric circuit, wherein the traceback circuit including the path memory has a shift register having at least (constraint length −1) bits as the number of stages, a signal generated by a decoder connected to the shift register and a content of the path memory designated by a traceback address counter are ANDed in units of bits, and the AND is input to the shift register.

According to the third aspect of the present invention, there is provided a Viterbi decoder wherein the path memory constituted by the first RAM defined in the second aspect is divided into a plurality of blocks, at least one upper bit of the shift register forms a chip select signal, a divided path memory is selected by the chip select signal, a decoding result of remaining bits of the shift register and a content of the path memory selected by the traceback counter and the chip select signal are ANDed in units of bits, and the AND is input to the shift register.

According to the fourth aspect of the present invention, there is provided a Viterbi decoder wherein the path metric memory constituted by the second RAM defined in the second aspect is divided into a plurality of blocks, each of the divided path metric memories comprises an ACS circuit, and sums corresponding to surviving paths selected by the ACS circuits are written in units of the divided memory groups in storing the sums as maximum likelihood of a state in the path metric memory.

According to the fifth aspect of the present invention, there is provided a Viterbi decoder further comprising an ACS circuit and a traceback circuit which start operating by an ACS start signal and a traceback start signal, the ACS circuit and the traceback circuit being event-driven by the respective start signals.

According to the sixth aspect of the present invention, there is provided a Viterbi decoder wherein when path memory stages in the traceback circuit defined in the second aspect are truncated by an appropriate length corresponding to a plurality of blocks, a truncation range overlaps preceding and succeeding truncation ranges in units of blocks, a traceback start position is set by a maximum likelihood decision circuit, and a start block of one surviving path in a truncation symbol corresponding to a state selected by traceback is used as decoded data.

According to the seventh aspect of the present invention, there is provided a Viterbi decoder wherein the path memory divided into the plurality of blocks defined in the sixth aspect is a ring buffer rotating in units of blocks, traceback starts from last data in a last block, and data corresponding to a start block is used as decoded data.

According to the eighth aspect of the present invention, there is provided a Viterbi decoder wherein a ring buffer formed by the path memory divided into the plurality of blocks defined in the sixth aspect is a RAM, and data update in units of blocks is realized by address control.

According to the ninth aspect of the present invention, there is provided a Viterbi decoder wherein input data corresponding to each of the blocks in the sixth aspect is time-compressed in units of blocks, and ACS processing and traceback are performed at a compression timing.

According to the first aspect, a small-size, light-weight Viterbi decoder capable of reducing the power consumption and improving the operability can be provided.

According to the second aspect, an optimum hardware architecture can be realized with a minimum number of optimized components, compared to a combination of a DSP and a Viterbi accelerator as a conventional architecture. Therefore, a small-size, light-weight Viterbi decoder capable of reducing the power consumption and improving the operability can be provided.

According to the third aspect, a path memory is divided into a plurality of blocks, and each divided path memory is selected by a chip select signal. Accordingly, a lower-power-consumption Viterbi decoder can be provided.

According to the fourth aspect, since a path metric RAM is divided and comprises an ACS circuit for each divided metric, parallel processing can increase the speed. Also, traceback is realized by the above hardware architecture, and a high-speed Viterbi decoder can be provided.

The Viterbi decoder of the present invention defined in the fifth aspect is of the type event-driven by ACS and traceback start signals. The Viterbi decoder can be released from limitations imposed by operation clocks and flexibly designed.

According to the sixth aspect, even if a signal has a long frame, traceback need not be frequently performed because path memories can be truncated in units of blocks. Therefore, a high-power-efficiency Viterbi decoder can be provided.

According to the seventh and eighth aspects, even when the truncation range overlaps preceding and succeeding truncation ranges upon memory truncation, a Viterbi decoder whose memory capacity is decreased by constructing path memories in a ring buffer shape can be provided.

According to the ninth aspect, since input data is time-compressed and processed in units of blocks, an event-driven Viterbi decoder capable of smooth traceback in units of blocks can be provided.

The above and many other objects, features and advantages of the present invention will become manifest to those skilled in the art upon making reference to the following detailed description and accompanying drawings in which preferred embodiments incorporating the principles of the present invention are shown by way of illustrative example.

BRIEF DESCRIPTION OF THE DRAWINGS

FIG. 6 is a block diagram showing an example of an event-driven architecture according to another embodiment of the present invention.

DETAILED DESCRIPTION OF PREFERRED EMBODIMENTS

Several preferred embodiments of the present invention will be described below with reference to the accompanying drawings.

Figure 1:
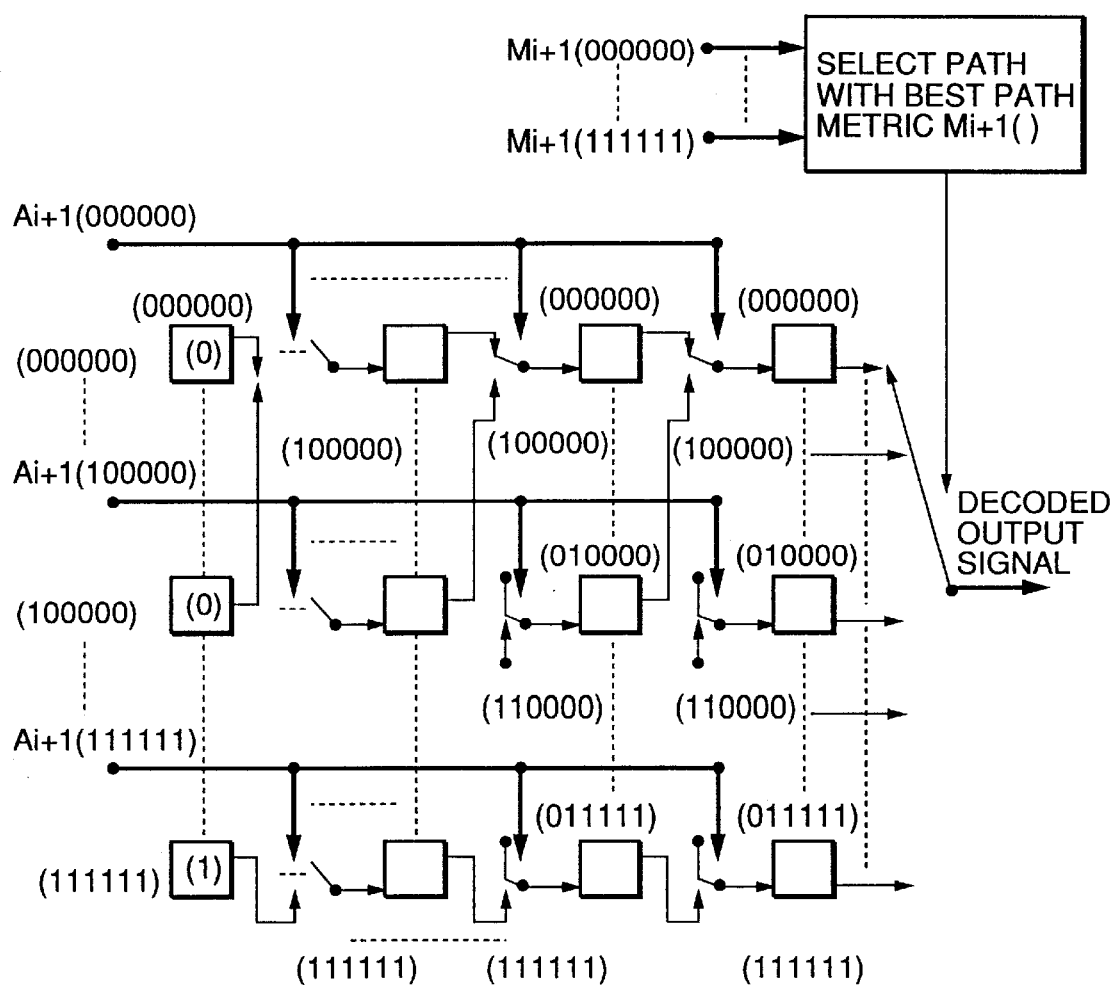
FIG. 1 is a block diagram showing an example of the arrangement of a conventional Viterbi decoder.
Figure 2:
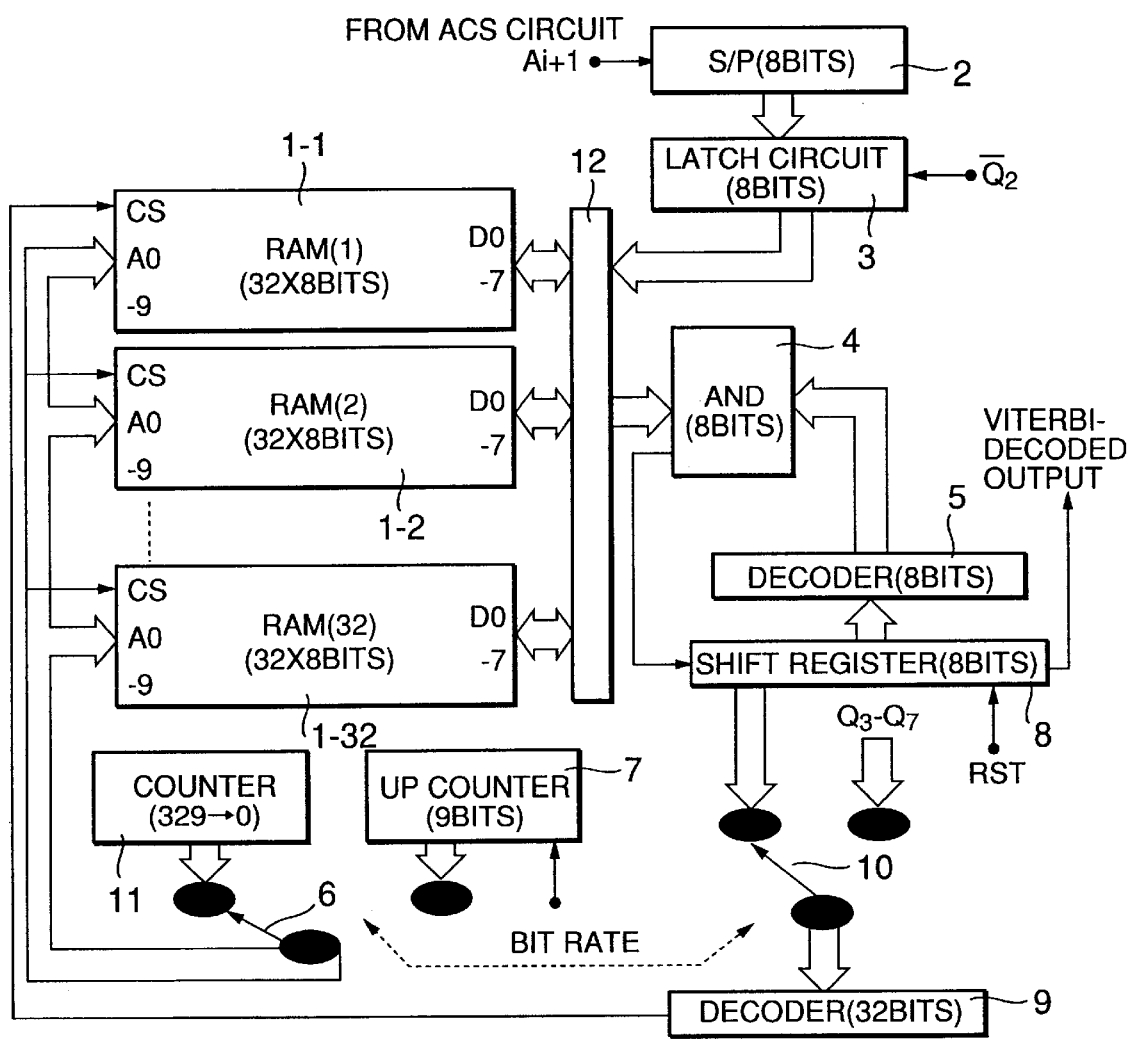
FIG. 2 is a. block diagram showing an example of the arrangement of an embodiment of the present invention.

FIG. 2 is a block diagram showing the arrangement of a traceback circuit which uses a Viterbi decoder as the first embodiment of the present invention and includes path memories. This traceback circuit comprises a shift register 8 having (constraint length–10 bits, counters 11 and 7 each having a count value corresponding to the frame length, a serial to parallel (S/P) converter 2 and a latch circuit 3 respectively for converting decision results sent from an ACS circuit (not shown) into parallel data and for storing the data in path memories 1-1, 1-2, . . . , 1-32, a decoder 9 for decoding the upper 5 bits of data in the shift register 8 and generating 32 chip select signals for the path memory banks 1- 1, 1-2, . . . , 1-32, a decoder 5 for generating comparison data for selection necessary bits from data obtained from chip-selected path memories, an AND circuit 4 for ANDing the selected bits and the comparison data in units of bits, and selectors 6 and 10 for selecting a state wherein the ACS operates to store comparison data in a path memory, or a state wherein data are extracted by traceback.

In FIG. 2, decision data sent from the ACS circuit are serial/parallel-converted by the S/P converter 2, and the results are stored in the latch circuit 3.

The state selectors 6 and 10 have been switched to store decision data. By address designation and chip selection, the decision data stored in the latch circuit 3 are sequentially stored in the path memories 1-1, 1-2, . . . , 1-32 from the start address.

After one-frame data are stored, the state selectors 6 and 10 are switched to extract data by traceback. The last value of the counter 7 is set in the counter 11 (setting of the last count value can be omitted by replacing the counters 11 and 7 with one up-down counter), which then counts down.

The last portion of the received signal is tail bits corresponding to 8×3=24 symbols. This portion corresponds to (constraint length −1) bits. All "0"s are set in the shift register 8, path memory address "1-1" is selected by chip selection of the decoder 9, and the selected data are output onto a bus 12 to the AND circuit 4. The data are ANDed with the data obtained by the decoder 5 in units of bits. In this case, since all "0"s are stored in the shift register 8, the first bit of the path memory is checked. The contents detected by the AND circuit 4 are fed back to the shift register 8. Based on these contents, the same processing is repeatedly performed to trace back the most probable path.

Figure 3:
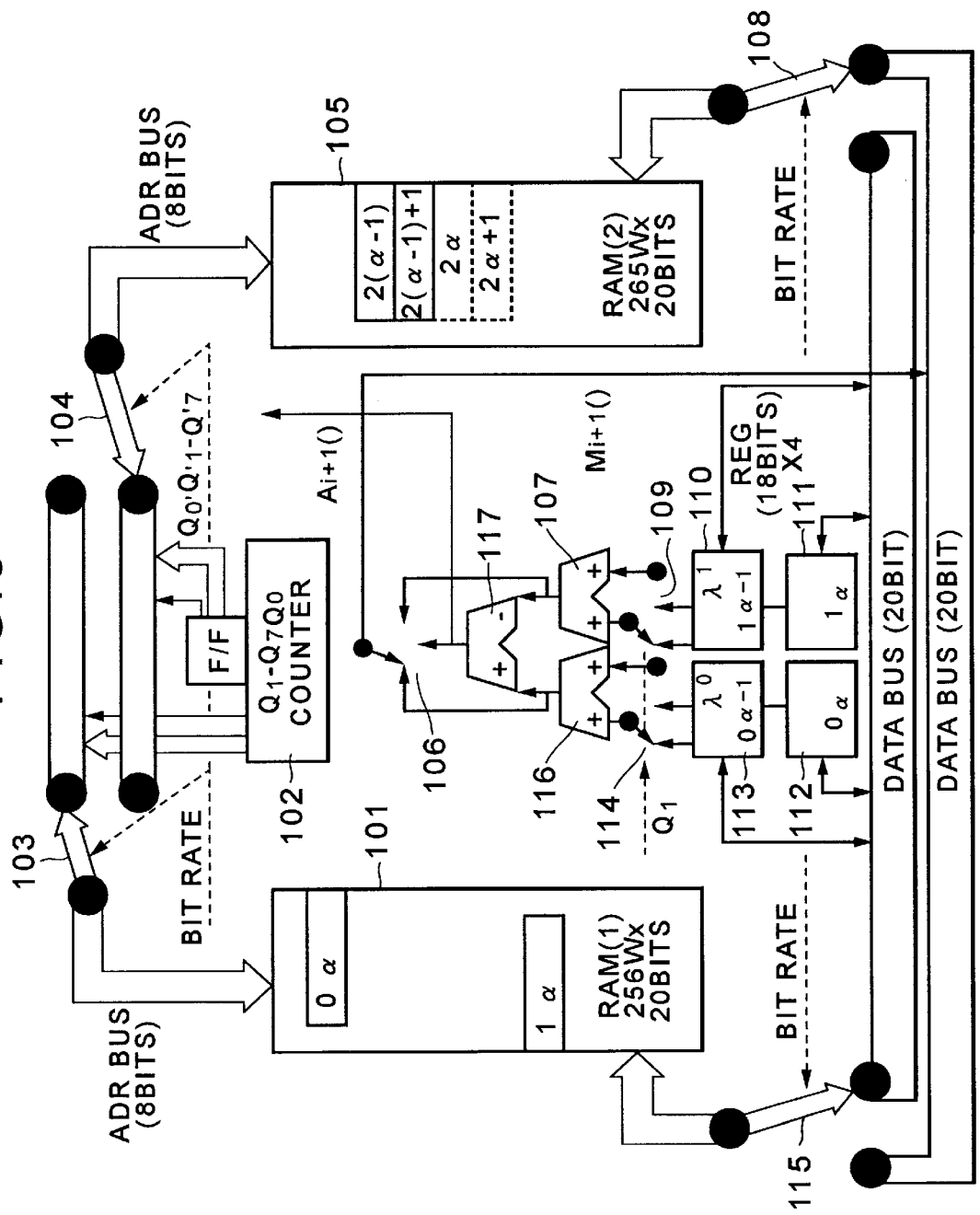
FIG. 3 is a block diagram showing an example of an ACS circuit of the present invention including a path metric memory built by a RAM.

FIG. 3 is a block diagram showing an example of the arrangement of an ACS circuit which sends decision data to the embodiment shown in FIG. 2 and includes a path metric memory built by a RAM.

The path metric memory includes two memories 101 and 105, one of which serves as an input sides while the other serves as the output side. The input and output sides are switched after all states are compared. Switching is done by selectors 103, 104, 108, and 115.

A counter 102 is used to set the address of an input path memory and the address of an output path memory. In the input path memory, the least significant bit of the counter is connected to the most significant bit of the address. In the output path memory, the least significant bit of the counter is connected to the least significant bit of the address. For example, state No. 0 is compared with No. 128, and the comparison results are stored in bit Nos. 0 and 1 of the output path memory.

After data temporarily stored in registers 113 and 110 are added by branch metric adders 116 and 107, the sums from these branch metric adders 116 and 107 are compared by a comparison adder 117 to determine the smaller one. The comparison results are sent to the traceback circuit including the above-described path memories. The comparison results are also used to select a metric. A state having high maximum likelihood is selected by a selector 106, and its contents are sent to the output path metric memory. Registers 112 and 111 read next data in advance in consideration of the memory speed.

Figure 4:
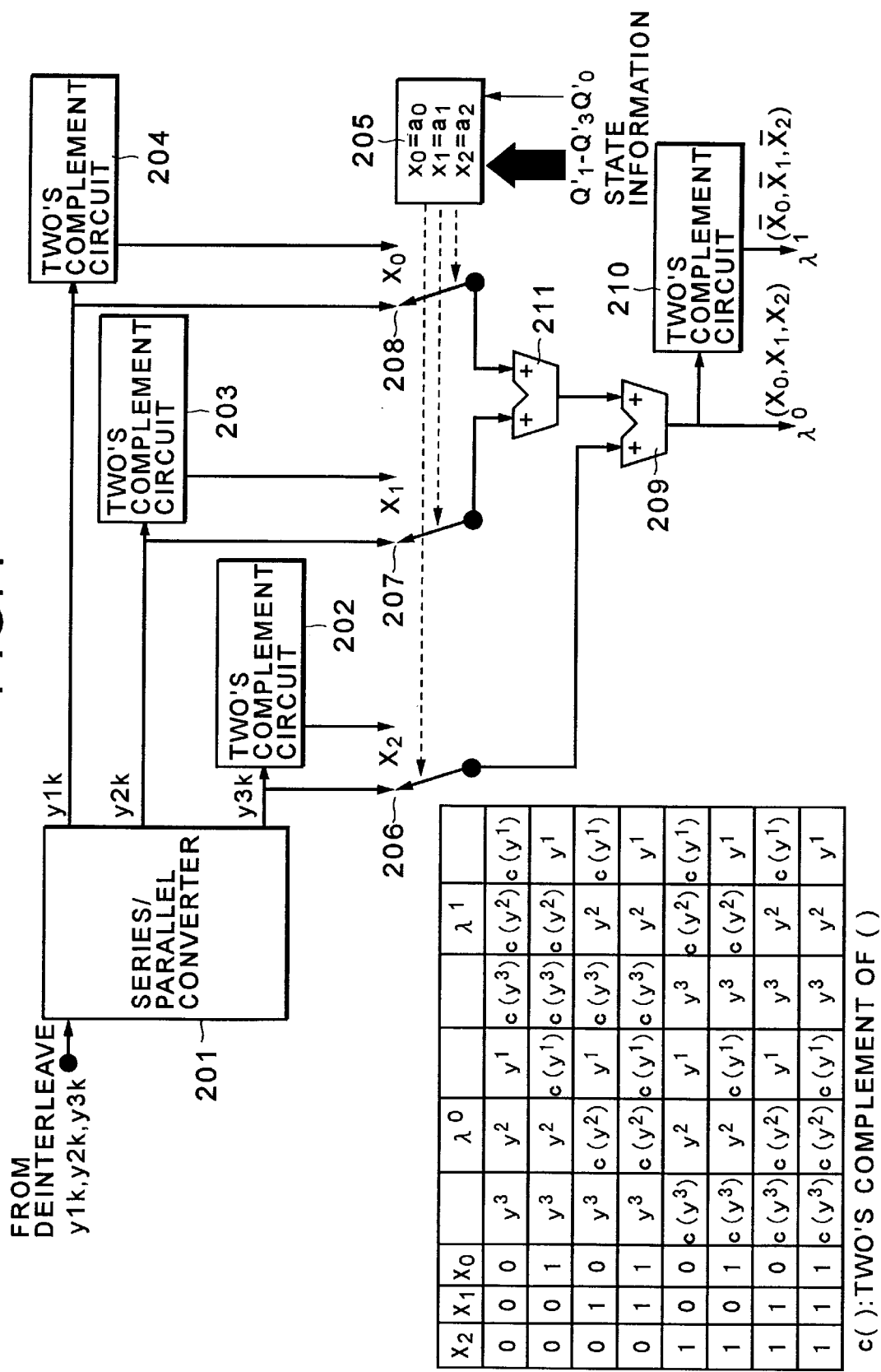
FIG. 4 is a block diagram showing an example of a branch metric generation circuit of the present invention.

FIG. 4 shows a branch metric generation circuit for sending a branch metric to an example of the ACS circuit (FIG. 3), including a path metric memory built by a RAM.

In FIG. 4, a series/parallel converter 201 converts serial data sent from a deinterleave unit (not shown) into 3-symbol parallel data. For the converted data, each of two's complement circuits 202, 203, and 204 prepares two positive and negative data.

Adders 211 and 209 generate a branch metric by adding data selected by selectors 206 to 208 which operate upon reception of a signal from a generating polynomial circuit 205. Since the adders 211 and 209 have the same generating polynomial as that on the source side, they generate selected branch metrics in accordance with the ACS operation of the path metric circuit. The timings of the adders 211 and 209 are synchronized with ACS using the counter value in FIG. 3. A two's complement circuit 210 generates a paired branch metric used for ACS.

Figure 5:
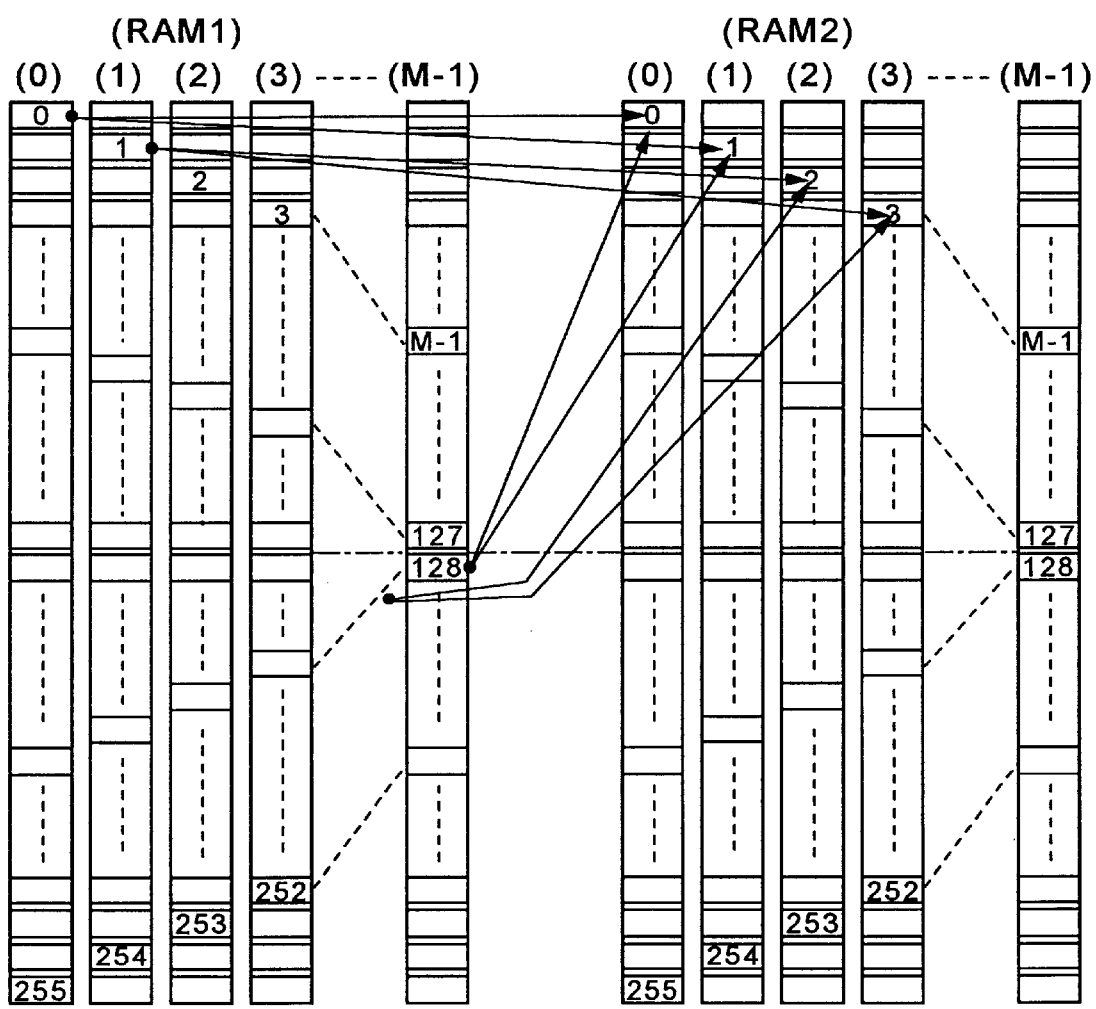
FIG. 5 is an explanatory view showing the operation of the present invention when M stages are parallel-processed.

FIG. 5 is a view for explaining high-speed ACS operation when path metric memories are divided into M branch stages, and the M stages are parallel-processed.

In FIG. 5, memory banks implement modulo M operation with respect to each state (address).

This will be explained separately for the input and output metric sides. The input side address pair are determined by a modulo operation in accordance with the bank number. In FIG. 5, as the state number increases, the bank number increases in modulo in the upper half of memories but the bank number decreases in modulo in the lower half. Banks can be freely paired as far as the upper and lower halves do not conflict with each other. If M is an even number, M/2 ACS pairs are arranged without any conflict.

In this state, the M/2 ACS pairs are shifted in units of blocks using M/2 ACSs as a unit block. If the upper half is the first memory bank group, the lower half is the second memory bank group. The M/2 ACS pairs can be parallel-processed without any conflict.

The output side address pair are an address twice the input side address, and this address plus one. Address banks are determined by a modM operation. Assuming that the upper half address of the input source addresses is adrUH, one output side address is (adrUH×2)modM+ (0,1). The upper-half memory bank group has a modulo address of 0 to (M/2)−1, and the lower half has (M/2) to M−1 (for e×M=4, 0,1 and 2,3).

For example, in the upper half, the real address is qM+{0 to (M/2)−1}. One output side address is twice this address, and thus 2qM+ (0 to M−2)even. modm is eliminated from this to obtain (0 to M−2)even for the memory bank. The other address is the one address plue one. Therefore, memory banks having the other type of addresses interleave between memory banks having one type of addresses. In this manner, the output path memory can be determined without any conflict, and the M/2 ACS pairs can be parallel-processed.

Similarly, in the lower half, the real address is qM to {(M/2) to M−1}. One output destination address is twice this address, and thus 2qM+2·{(M/2) to M−1}even=2q'M+{0 to M−2}even. modM is eliminated from this to obtain {0 to M−2}even for the memory bank. The other address is the one address plus one. Memory banks having the other type of addresses interleave between memory banks having one type of addresses. As a result, the output path memory can be determined without any conflict.

The M/2 ACS pairs can be parallel-processed within the whole range.

FIG. 6 is a block diagram showing an event-driven embodiment as another embodiment of the present invention.

According to this embodiment, each block starts operating by a start signal from a sequencer 501, and sends back an end signal upon completion of the operation. Limitations imposed by operation clocks necessary for the blocks are removed, realizing a clock-free architecture. The operation of this embodiment will be sequentially described.

Upon reception of a 3-symbol soft decision data, the sequencer 501 sends a serial/parallel conversion start signal to a branch metric block 502, which corresponds to FIG. 4. Upon reception of the start signal, the branch metric block 502 performs serial/parallel conversion, interlocks with the ACS operation to transmit a branch metric, and sends back a conversion end signal to the sequencer 501.

When branch metric transmission becomes possible, the sequencer 501 sends a generating polynomial circuit signal output start & ACS operation start signal to a path metric & ACS block 503, which corresponds to FIG. 3. Upon reception of the start signal, the path metric & ACS block 503 starts ACS operation while sending a signal corresponding to the ACS operation to generating polynomial circuit.

The decision results obtained by the ACS operation are sent to a path memory write block 504 (the corresponding function having been described above in connection with FIG. 2), and written by a write start signal from the sequencer 501.

This operation is repeatedly performed for all states decided from the three symbols. The sequencer 501 stops supply of operation clocks to each block and saves the battery until next three symbols are input. For the next three symbols, the same processing is repeatedly performed to complete one frame processing.

After one-frame data is written, the path memory write block 504 sends back a 1-frame end signal to the sequencer 501. Upon reception of this signal, the sequencer 501 sends a traceback start signal to a path memory traceback block 505 as described in connection with FIG. 2. Upon reception of the start signal, the traceback block 505 starts traceback and stores the results in an FILO (first In Last Out) circuit.

Upon completion of one-frame traceback, the traceback block sends back an end signal to the sequencer 501.

The sequencer 501 sends a data output & CRC check start signal to a data output block 506. The data output block 506 sends data and checks CRC in synchronism with the transmission timing, and sends an end signal to the sequencer 501 upon completion of the operation.

When each block finishes its operation, the sequencer 501 stops supply of operation clocks to the block to set the battery saving mode. The sequencer 501 receives one-frame data whose length is time-compressed, and performs traceback during the idle times between frames. Accordingly, the sequencer 501 can successively receive frames.

This embodiment is of the event-driven type by start and end signals. Even if the symbol rate changes, data can be processed within the maximum operation speed of each block. The battery is saved for a block having completed its operation, and the power consumption can be flexibly reduced. Further, the blocks can be independently tested.

Figure 7A:
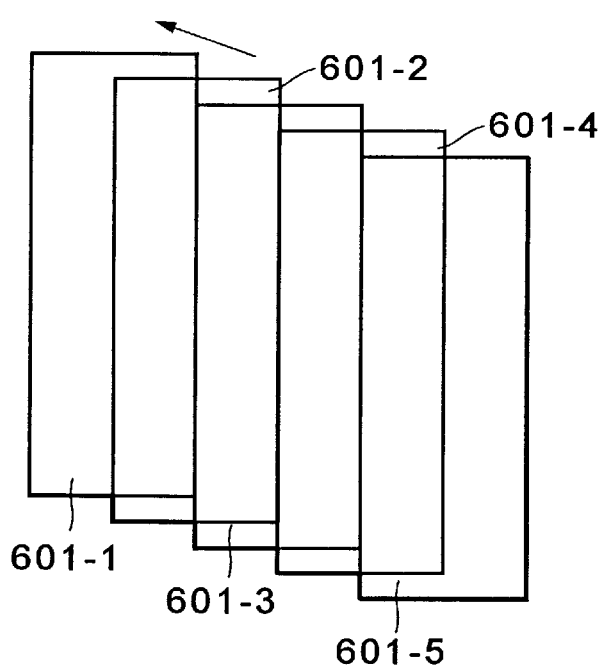
FIGS. 7A and 7B are explanatory views, respectively, showing an example of path memory block truncation and the traceback start memory address position according to still another embodiment of the present invention.
Figure 7B:
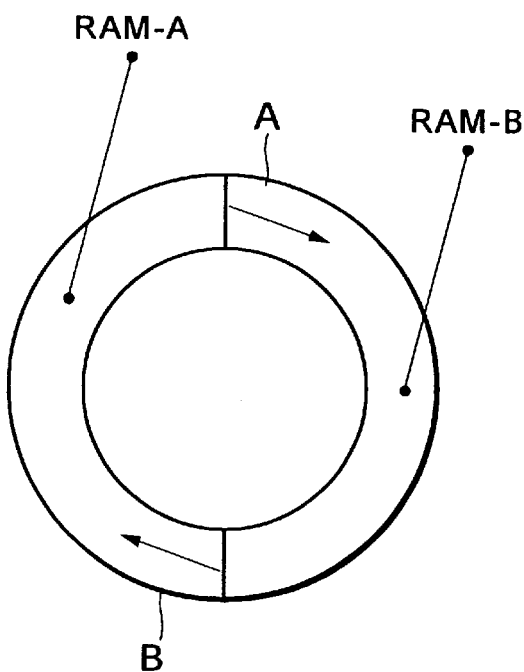

FIGS. 7A and 7B are explanatory views of still another embodiment of the present invention in which the stages of path memories are truncated by the length of a plurality of blocks in traceback such that the truncation range overlaps preceding and succeeding truncation ranges in units of blocks.

In FIG. 7A, a path memory 601-1 is first used. When decision data are stored to the last address in the path memory 601-1, data detected from a traceback start position set by a maximum likelihood decision circuit to a half-trace back position are used as compound data.

The path memory changes to a path memory 601-2. When half path memory data are added, data are similarly traced back from the last maximum likelihood decision position, and only the second half results are used as compound data.

With the same processing for path memories 601-3, . . . , data are traced back to overlap each other, and the ranges truncated in units of blocks are compounded. The path memories 601-1, 601-2, 601-3, . . . construct a ring buffer structure in which the first and second halves are linked. Accordingly, the ACS decision results are seamlessly stored.

The traceback start memory address position is alternately controlled between points A and B, as shown in FIG. 7B. In the first embodiment, since traceback is performed between frames, the traceback time is ensured by time-compressing data in units of frames. In the embodiment shown in FIGS. 7A and 7B, since frames are divided in units of blocks, the traceback time is ensured by time-compressing data in units of half blocks.

What we claim is:

1. A Viterbi decoder for Viberbi-decoding an input signal, comprising:
   a path memory;
   a shift register having at least (constraint length −1) bits as the number of stages;
   a traceback circuit for inputting, to said shift register, a signal resulting from a bit-wise AND operation between a signal generated by a decoder connected to said shift register and a content of said path memory designated by a traceback address counter.

2. A Viterbi decoder comprising:
   a traceback circuit including a path memory comprised of a first RAM;
   an ACS circuit including a path metric memory comprised of a second RAM; and
   a branch metric circuit,
   wherein said traceback circuit including the path memory has a shift register having at least (constraint −1) bits as the number of stages, a bit-wise AND operation is performed on a signal generated by a decoder connected to the shift register and a content of the path memory designated by a traceback address counter, and the result of the bit-wise AND is inputted to the shift register.

3. A decoder according to claim 2, wherein:
   the RAM which comprises the path memory is divided into a plurality of blocks;
   at least one upper bit of the shift register is used to form a chip select signal;
   the chip select signal and an output of the traceback address counter are used to select blocks comprising a portion of the divided path memory;
   the decoder is connected to the bits of the shift register not used to form the chip select signal; and
   the bit-wise AND operation is performed on the signal generated by the decoder and data stored in the selected portion of the path memory.

4. A decoder according to claim 2, wherein the second RAM that comprises the path metric memory is divided into a plurality of blocks, each of the divided path metric memories comprises an ACS circuit, and sums corresponding to surviving paths selected by the ACS circuits are written in units of the divided memory groups in storing the sums a maximum likelihood of a state in the path metric memory.

5. A Viterbi decoder comprising:
   a path memory;
   a shift register;
   a traceback circuit for inputting to said shift register, a signal resulting from a bit-wise AND operation between a signal generated by a decoder connected to said shift register and data from said path memory designated by said traceback circuit,
   the path memory stages in the traceback circuit being truncated by lengths corresponding to a plurality of blocks, with truncation ranges overlapping preceding and succeeding truncation ranges in units of blocks; and further including
   a maximum likelihood decision circuit that sets a traceback start position,
   a start block of one surviving path in a truncation symbol for a state selected by traceback being used as decoded data.

6. A decoder according to claim 5, wherein the path memory divided into the plurality of blocks is a ring buffer rotating in units of blocks, traceback starts from the end of a last block, and data corresponding to a start block is used as decoded data.

7. A decoder according to claim 5, wherein the path memory forms a ring buffer, and data update in units of blocks is realized by address control.

8. A decoder according to claim 5, wherein input data corresponding to each of the blocks is time-compressed in units of blocks, and ACS processing and traceback are performed at a compressed timing.

9. A Viterbi decoder comprising:
   a traceback circuit including a path memory;
   an ACS circuit including a path metric memory;
   a branch metric circuit;
   a shift register that provides a Viturbi-decoded output;
   a decoder connected to the shift register, the traceback circuit being operative to input to said shift register, a signal resulting from a bit-wise AND operation between a signal generated by the decoder and data from said path memory designated by said traceback circuit; and a sequencer for generating start signals for the traceback circuit, the ACS circuit and the branch metric circuit such that for a single output frame, the ACS circuit begins its operation upon completion of the operation of the branch metric circuit, the path memory traceback circuit begins its operation upon completion of the operation of the ACS circuit and a frame is outputted after completion of the operation of the path memory traceback circuit.

10. A Viterbi decoder comprising:

a path memory;

a shift register;

a traceback circuit for inputting to said shift register, a signal resulting from a bit-wise AND operation between a signal generated by a decoder connected to said shift register and data from said path memory designated by said traceback circuit.

* * * * *